United States Patent
Tanaka

(10) Patent No.: US 12,424,469 B2
(45) Date of Patent: Sep. 23, 2025

(54) PROCESS MONITOR AND PROCESS MONITORING METHOD

(71) Applicant: SUMITOMO HEAVY INDUSTRIES, LTD., Tokyo (JP)

(72) Inventor: Teppei Tanaka, Yokosuka (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 527 days.

(21) Appl. No.: 17/933,095

(22) Filed: Sep. 17, 2022

(65) Prior Publication Data

US 2023/0011199 A1 Jan. 12, 2023

Related U.S. Application Data

(63) Continuation of application No. PCT/JP2021/007107, filed on Feb. 25, 2021.

(30) Foreign Application Priority Data

Mar. 24, 2020 (JP) ................................. 2020-052662

(51) Int. Cl.
*H01L 21/67* (2006.01)
*G01J 5/00* (2022.01)

(52) U.S. Cl.
CPC .......... *H01L 21/67253* (2013.01); *G01J 5/00* (2013.01)

(58) Field of Classification Search
CPC ......... H01L 21/67253; H01L 21/67115; H01L 21/67248; H01L 21/268; G01J 5/00; G01J 5/60; G01J 3/02; G01J 5/0007; B23K 26/354
See application file for complete search history.

(56) References Cited

U.S. PATENT DOCUMENTS

| | | | | |
|---|---|---|---|---|
| 5,061,084 A | * | 10/1991 | Thompson ............ | G01J 5/0007 374/127 |
| 6,917,039 B2 | * | 7/2005 | Nicolaides ........... | G01N 21/171 250/341.1 |
| 7,280,215 B2 | * | 10/2007 | Salnik .................. | G01N 21/636 356/432 |
| 7,398,693 B2 | * | 7/2008 | Ranish ................... | H01L 22/12 257/E21.53 |

(Continued)

FOREIGN PATENT DOCUMENTS

| | | | | |
|---|---|---|---|---|
| JP | 60-131430 A | | 7/1985 | |
| JP | S60131430 A | * | 7/1985 | ................ G01J 5/08 |

(Continued)

OTHER PUBLICATIONS

European Search Report of EP Application No. 21777149.2 Mailed on Sep. 27, 2023.

(Continued)

*Primary Examiner* — Mohammed Shamsuzzaman
(74) *Attorney, Agent, or Firm* — WTA IP Law P.C.

(57) ABSTRACT

A process monitor includes a photodetector that separately measures intensities of radiant light from a semiconductor member being annealed, in a plurality of wavelength ranges that are different from each other, and a processing device that obtains a physical quantity related to the semiconductor (Continued)

member that changes due to annealing, based on the intensities in the plurality of wavelength ranges measured by the photodetector.

5 Claims, 7 Drawing Sheets

(56) References Cited

U.S. PATENT DOCUMENTS

| | | | | |
|---|---|---|---|---|
| 7,705,977 | B2* | 4/2010 | Salnik | G01N 21/1717 356/237.2 |
| 9,952,161 | B2* | 4/2018 | Pfaff | G01B 9/02011 |
| 11,257,686 | B2* | 2/2022 | Tanaka | H01L 21/324 |
| 2003/0203517 | A1* | 10/2003 | Suzuki | H01L 22/20 257/E21.632 |
| 2005/0062971 | A1* | 3/2005 | Salnik | G01N 21/636 356/432 |
| 2007/0238202 | A1* | 10/2007 | Ranish | H01L 22/12 257/E21.53 |
| 2008/0151247 | A1* | 6/2008 | Salnik | G01N 21/1717 356/432 |
| 2013/0146568 | A1* | 6/2013 | Moffitt | B23K 26/06 219/121.76 |
| 2018/0330946 | A1* | 11/2018 | Reano | G02F 1/025 |
| 2019/0074192 | A1* | 3/2019 | Tanaka | H01L 22/14 |
| 2025/0001526 | A1* | 1/2025 | Matsunaga | B23K 26/38 |

FOREIGN PATENT DOCUMENTS

| | | | | |
|---|---|---|---|---|
| JP | H0936489 A | * | 2/1997 | H01L 21/67109 |
| JP | 2007-81348 A | | 3/2007 | |
| JP | 2007263583 A | * | 10/2007 | H05B 6/062 |
| JP | 2010225613 A | * | 10/2010 | H01L 21/67109 |
| JP | 5006560 B2 | * | 8/2012 | H05B 6/062 |
| KR | 20150008835 A | * | 1/2015 | H01L 21/683 |
| TW | 202135121 A | * | 9/2021 | H01L 21/67109 |

OTHER PUBLICATIONS

PCT International Search Report of PCT/JP2021/007107 mailed Apr. 27, 2021 by Japan Patent Office.

* cited by examiner

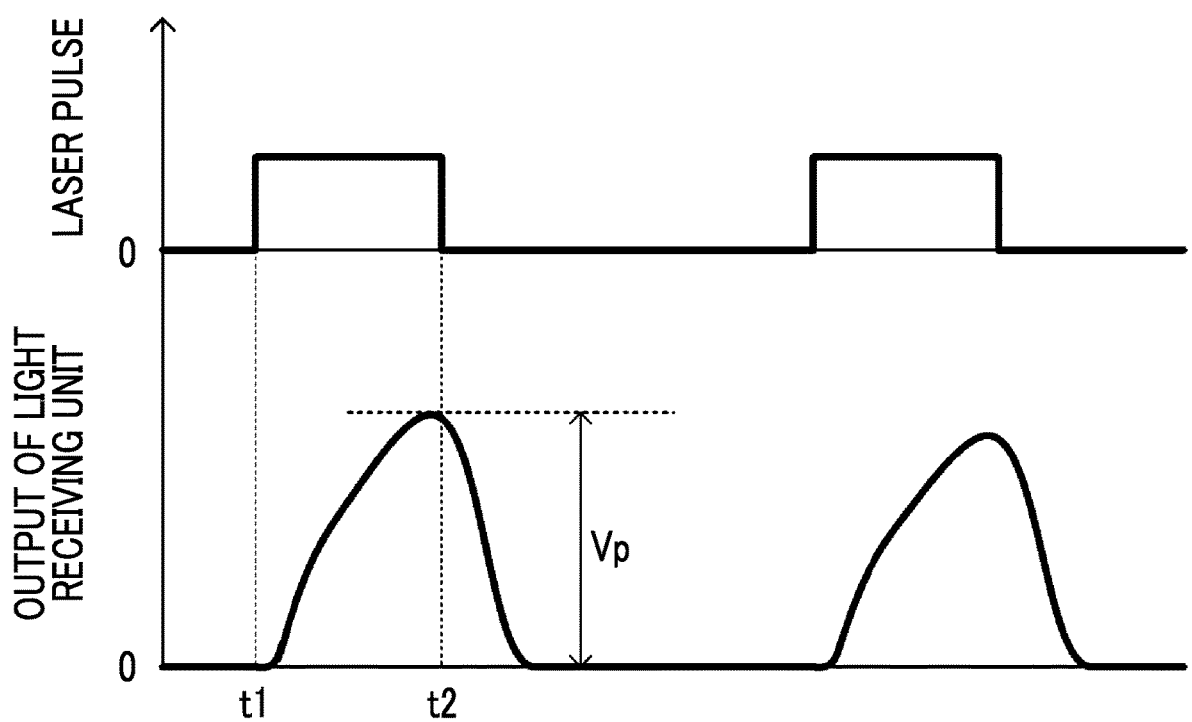

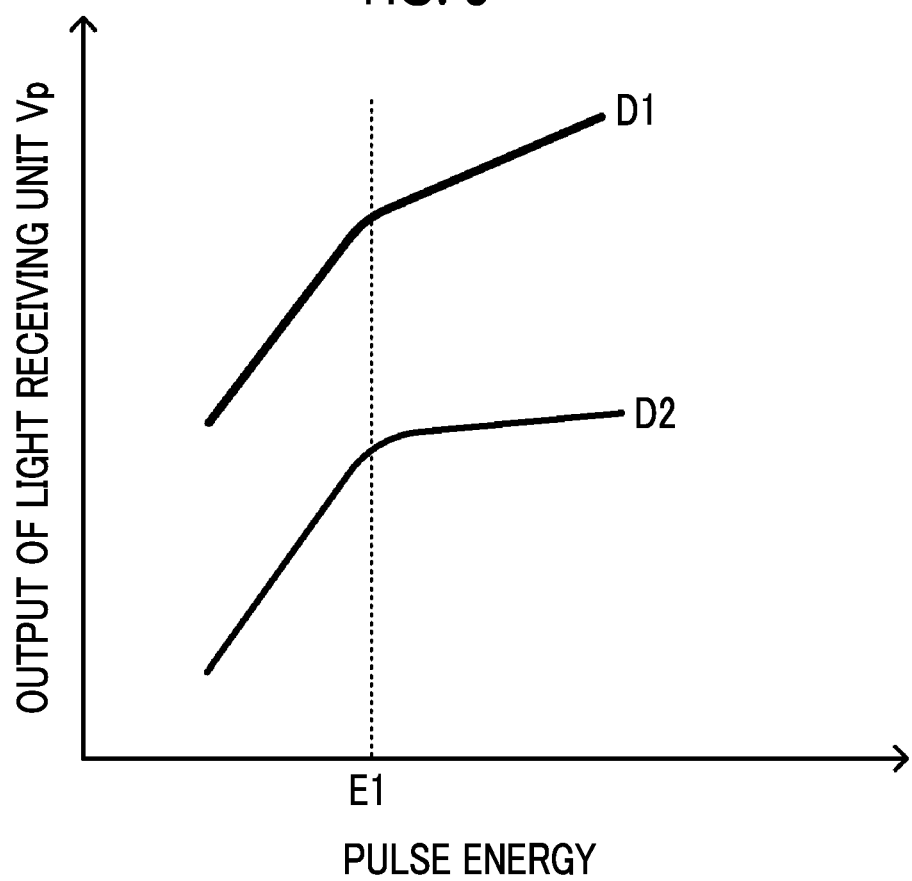

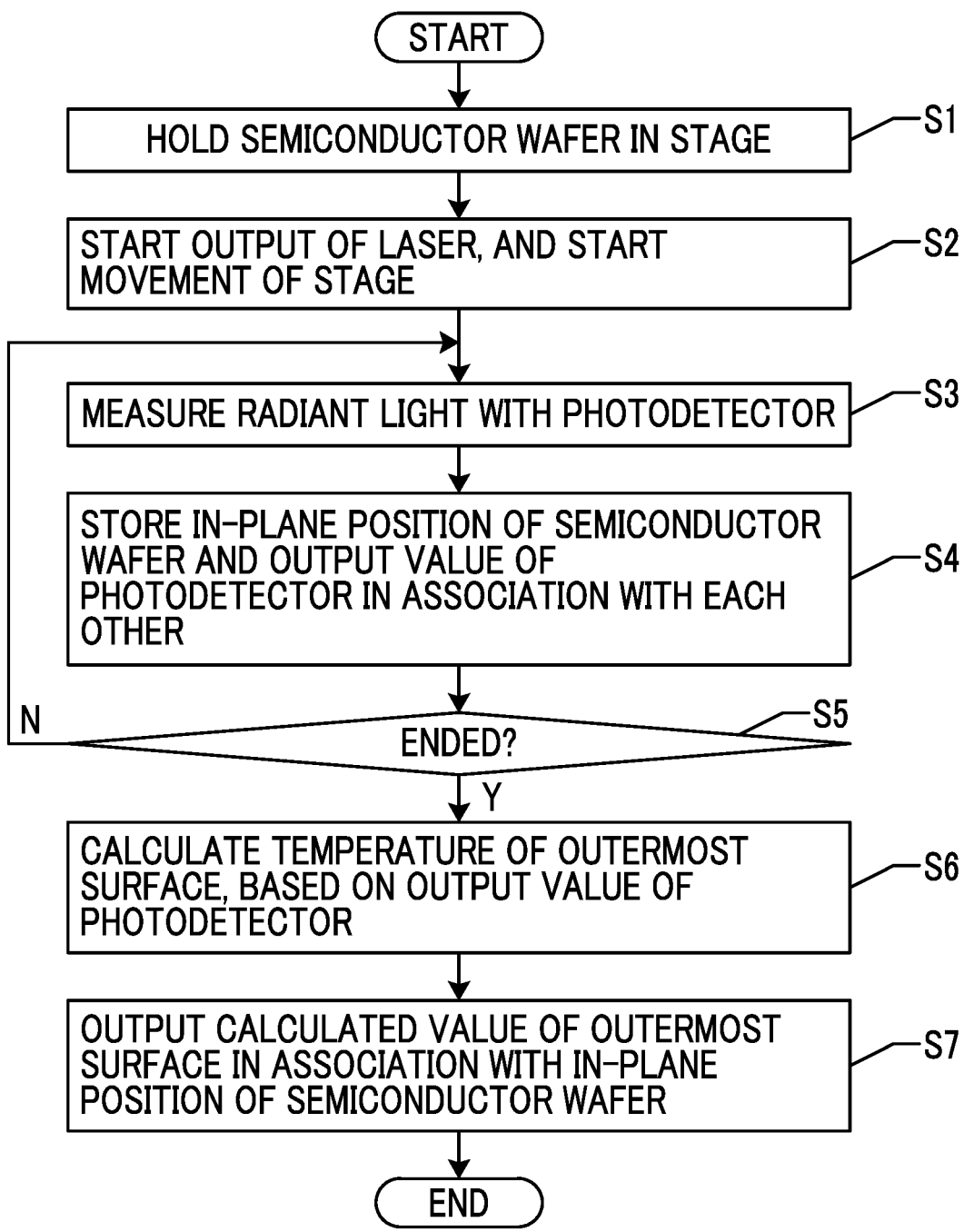

PROCESS MONITOR AND PROCESS MONITORING METHOD

CROSS-REFERENCE TO RELATED APPLICATIONS

This is a bypass continuation of International PCT Patent Application No. PCT/JP2021/007107, filed on Feb. 25, 2021, which claims priority to Japanese Patent Application No. 2020-052662, filed on Mar. 24, 2020, which are incorporated by reference herein in their entirety.

BACKGROUND

Technical Field

A certain embodiment of the present invention relates to a process monitor and a process monitoring method for obtaining a physical quantity that changes due to annealing of a semiconductor member.

Description of Related Art

In the related art, as an example of a method for identifying the in-plane distribution in the activated state of a semiconductor wafer in which a dopant is injected, and activated and annealed, sheet resistance has been measured. The activated state of the dopant can be evaluated from the in-plane distribution of the sheet resistance.

SUMMARY

According to an embodiment of the present invention, there is provided a process monitor including:
 a photodetector that separately measures intensities of radiant light from a semiconductor member being annealed, in a plurality of wavelength ranges that are different from each other; and
 a processing device that obtains a physical quantity related to the semiconductor member that changes due to annealing, based on the intensities in the plurality of wavelength ranges measured by the photodetector.

According to another embodiment of the present invention, there is provided a process monitoring method including:
 annealing a semiconductor member;
 separately measuring intensities of radiant light from a semiconductor member being annealed, in a plurality of wavelength ranges that are different from each other; and
 obtaining a physical quantity related to the semiconductor member that changes due to annealing, based on a measurement result.

BRIEF DESCRIPTION OF THE DRAWINGS

FIG. 3 is a graph showing an example of a pulse of a pulsed laser beam output from a laser source and an output signal waveform of two light receiving units of a photodetector.

FIG. 6 is a graph that approximates a curve of a scatter plot in which an example of the output values of the two light receiving units is plotted with respect to the pulse energy.

FIG. 7 is a flowchart showing a procedure for performing laser annealing of a semiconductor wafer by using a laser annealing device equipped with a process monitor according to an embodiment.

DETAILED DESCRIPTION

The four-point probe method is generally used to measure the sheet resistance. The measurement of sheet resistance by using the four-point probe method is performed after annealing with a device different from the activation annealing device. Therefore, the measurement of sheet resistance is an offline work, which is troublesome. In addition, the semiconductor wafer is damaged because the probe needs to be brought into contact with the semiconductor wafer. Further, in order to determine the quality of the annealing result, there is a request to measure the temperature of the semiconductor wafer being annealed.

It is desirable to provide a process monitor and a process monitoring method capable of measuring a physical quantity related to a semiconductor member that changes due to annealing without damaging the semiconductor member.

A process monitor and a process monitoring method according to the embodiment will be described with reference to FIGS. 1 to 7.

Figure 1:
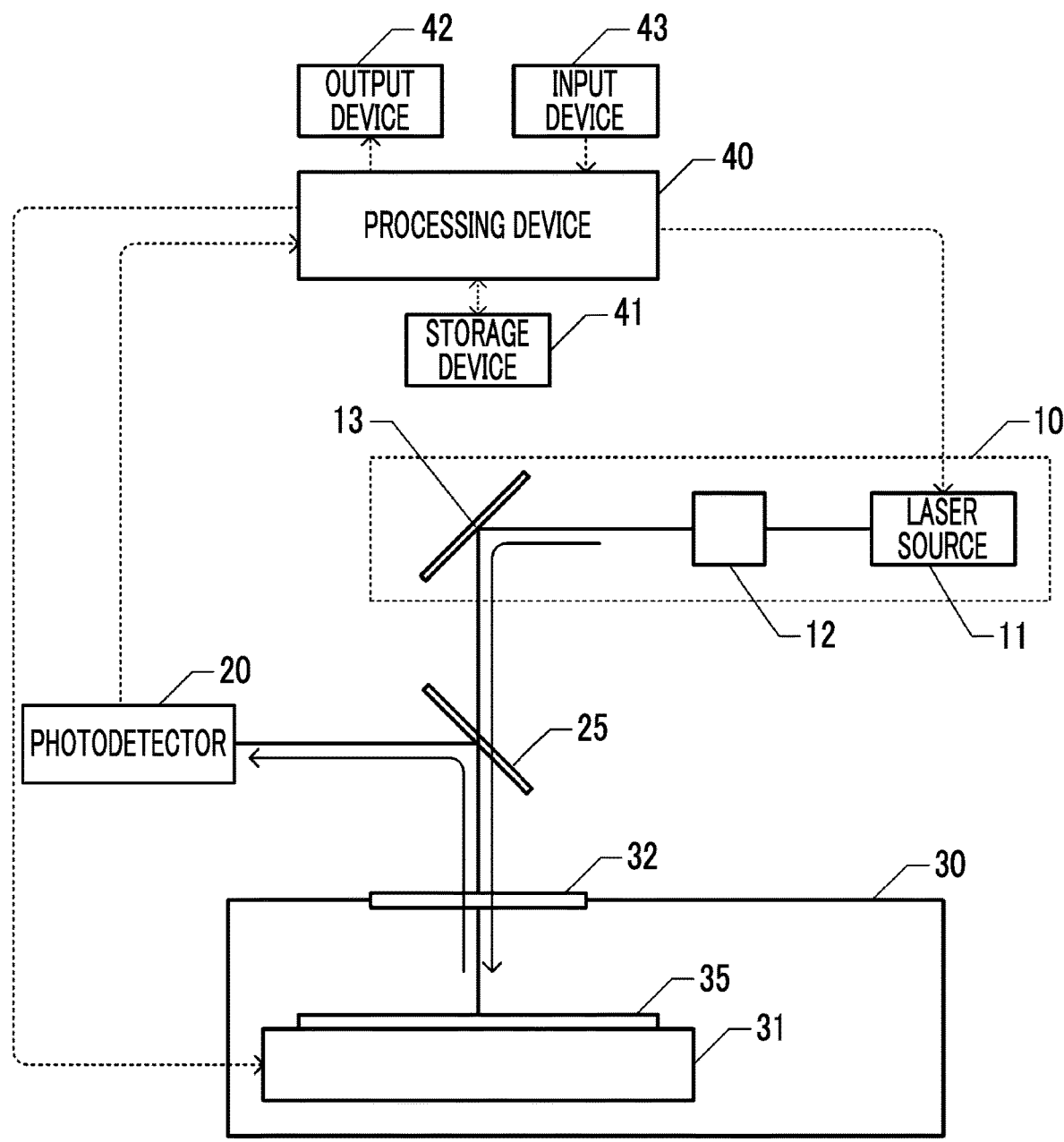
FIG. 1 is a schematic diagram of a laser annealing device equipped with a process monitor according to an embodiment.

FIG. 1 is a schematic diagram of a laser annealing device equipped with a process monitor according to the embodiment. The laser annealing device includes a laser optical system 10, a chamber 30, a photodetector 20, a processing device 40, a storage device 41, an output device 42, and an input device 43. The function of the process monitor is implemented by the photodetector 20, the processing device 40, and the like.

The laser optical system 10 includes a laser source 11, a uniformizing optical system 12, and a folding mirror 13. The laser source 11 outputs a laser beam in the infrared region. As the laser source 11, for example, a laser diode having an oscillation wavelength of 808 nm can be used. The uniformizing optical system 12 equalizes the beam profile of the laser beam output from the laser source 11. The folding mirror 13 reflects the laser beam that has passed through the uniformizing optical system 12 downward.

A window 32 through which a laser beam is transmitted is provided on the top plate of the chamber 30, and a stage 31 is disposed in the chamber 30. The semiconductor wafer 35, which is to be annealed, is held on the stage 31. A dopant is injected into the outer layer portion of the semiconductor wafer 35. For the injection of the dopant, for example, the ion implantation method is used. Prior to annealing, the dopant is not activated. As the semiconductor wafer 35, for example, a silicon wafer can be used. As the dopant, for example, phosphorus (P), arsenic (As), boron (B), and the like can be used.

The laser beam output from the laser optical system 10 transmits through the dichroic mirror 25 and the window 32 and is incident on the semiconductor wafer 35 held on the stage 31. A mirror, a lens, or the like may be disposed in the path of the laser beam, if necessary. The beam spot of the laser beam on the surface of the semiconductor wafer 35 has a long shape that is long in one direction, and is, for example, about 3 mm to 5 mm in length and about 0.1 mm to 0.3 mm in width. When the laser beam is incident on the semiconductor wafer 35, the outer layer portion of the semiconductor wafer 35 is heated at the position of the beam spot. The stage 31 is controlled by the processing device 40 to move the semiconductor wafer 35 in two directions parallel to its surface. By scanning the beam spot on the surface of the semiconductor wafer 35 in the width direction and sub-scanning in the length direction, almost the entire upper surface of the semiconductor wafer 35 can be laser-annealed.

When the laser beam is incident on the semiconductor wafer 35, the outer layer portion at the incident position is heated, so that the dopant is activated. The radiant light is emitted from the heated portion. A part of the radiant light emitted from the semiconductor wafer 35 is reflected by the dichroic mirror 25 and incident on the photodetector 20. The dichroic mirror 25 transmits light in a wavelength range shorter than, for example, 1 μm, and reflects light in a wavelength range longer than 1 μm. If necessary, a lens, an optical filter, or the like may be disposed in the path of radiant light from the semiconductor wafer 35 to the photodetector 20. The photodetector 20 and the optical components on the path of radiant light will be described later with reference to FIGS. 2A and 2B.

The processing device 40 acquires a detection signal output from the photodetector 20 in synchronization with each shot of the pulsed laser beam. Further, the magnitude (output value) of the acquired detection signal is stored in the storage device 41 in association with in-plane position of the semiconductor wafer 35. As an example, for each shot of the pulsed laser beam, the temporal waveform of the output value is obtained corresponding to the temporal change of the intensity of the radiant light. The output value stored in the storage device 41 is, for example, the peak value of the temporal waveform of the pulsed laser beam for each shot.

Various commands and data for instructing the operations of the process monitor and the laser annealing device are input to the processing device 40 through the input device 43. The processing device 40 outputs the monitor result from the process monitor to the output device 42.

Figure 2A:
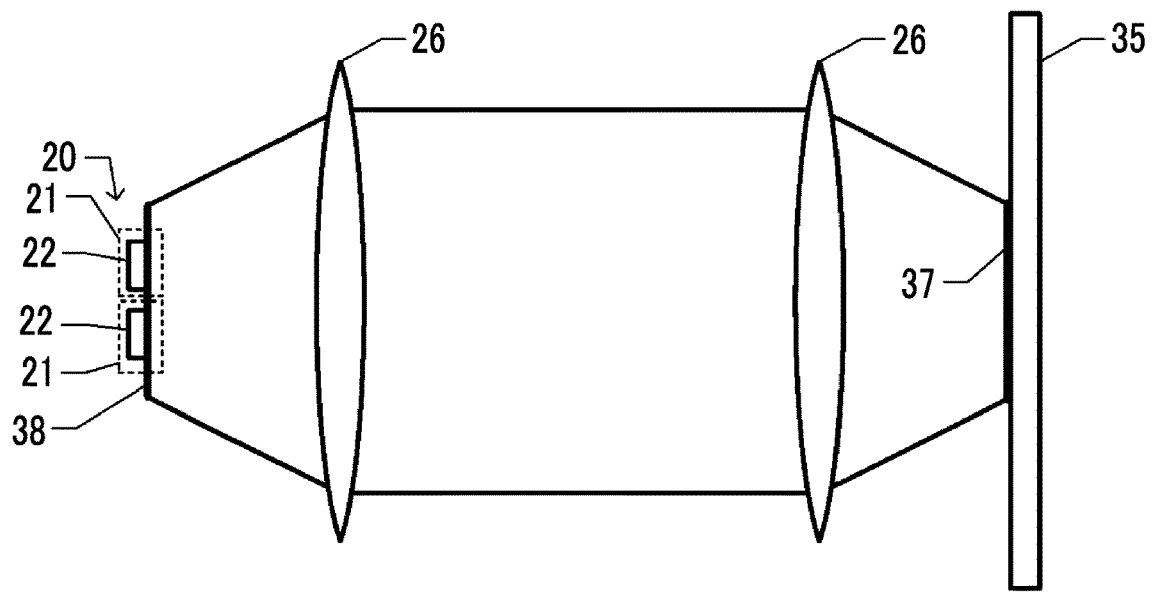
FIG. 2A is a schematic diagram showing a configuration example of a photodetector, and optical components disposed in a path of radiant light.

FIG. 2A is a schematic diagram showing a configuration example of a photodetector 20 and an optical components disposed in a path of radiant light. The radiant light is emitted from the region corresponding to the beam spot 37 of the pulsed laser beam incident on the surface of the semiconductor wafer 35. The emitted radiant light is incident on the photodetector 20 through the two lenses 26. For example, one of the two lenses 26 is disposed between the dichroic mirror 25 (FIG. 1) and the semiconductor wafer 35, and the other is disposed between the dichroic mirror 25 and the photodetector 20. The two lenses 26 configure an imaging optical system that forms an image of a beam spot 37 on the surface of the semiconductor wafer 35 at a position where the photodetector 20 is disposed. That is, the surface of the semiconductor wafer 35 and the light receiving surface of the photodetector 20 are an object surface and an image surface, respectively.

The photodetector 20 includes two light receiving units 21 that separately measure the intensity of radiant light. The two light receiving units 21 are disposed at different positions with respect to the longitudinal direction of the image 38 of the beam spot 37. The two light receiving units 21 each include an optical sensor 22 having a different peak sensitivity wavelength. Each of the optical sensors 22 outputs a signal (voltage) having the sensitivity in the infrared wavelength range and having a magnitude corresponding to the intensity of the input radiant light. The signals output from the two optical sensors 22 are input to the processing device 40.

Figure 2B:
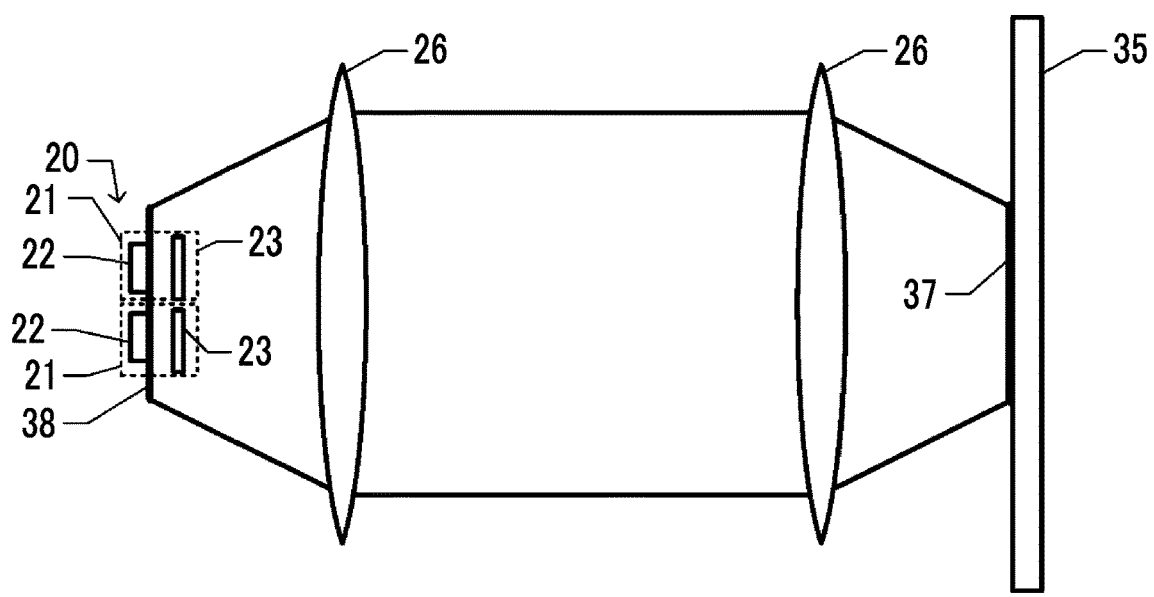
FIG. 2B is a schematic diagram showing another configuration example of a photodetector and optical components disposed in the path of radiant light.

FIG. 2B is a schematic diagram showing another configuration example of a photodetector 20 and an optical components disposed in a path of radiant light. In the configuration example shown in FIG. 2A, the two light receiving units 21 each include an optical sensor 22 having a different peak sensitivity wavelength. On the other hand, in the configuration example shown in FIG. 2B, the two light receiving units 21 each include an optical sensor 22 having the same spectral sensitivity characteristic and a bandpass filter 23 having a different passing wavelength range. The radiant light transmitted through the bandpass filter 23 is incident on the optical sensor 22. Therefore, the peak sensitivity wavelengths of the two light receiving units 21 are different.

FIG. 3 is a graph showing an example of a pulse of a pulsed laser beam output from the laser source 11 and an output signal waveform of two light receiving units 21 of the photodetector 20. When the laser pulse rises at time t1, the output value of the light receiving unit 21 gradually increases in response to the temperature increase of the outer layer portion of the semiconductor wafer 35. When the laser pulse falls at time t2, the output value of the light receiving unit 21 gradually decreases in response to the temperature decrease of the outer layer portion of the semiconductor wafer 35. The peak intensity Vp of the output of the light receiving unit 21 due to the laser pulse from time t1 to t2 is stored in the storage device 41 for each light receiving unit 21. Normally, this peak intensity Vp differs between the two light receiving units 21.

Next, the advantageous effects of the present embodiment will be described with reference to FIGS. 4A to 5D.

Figure 4A:
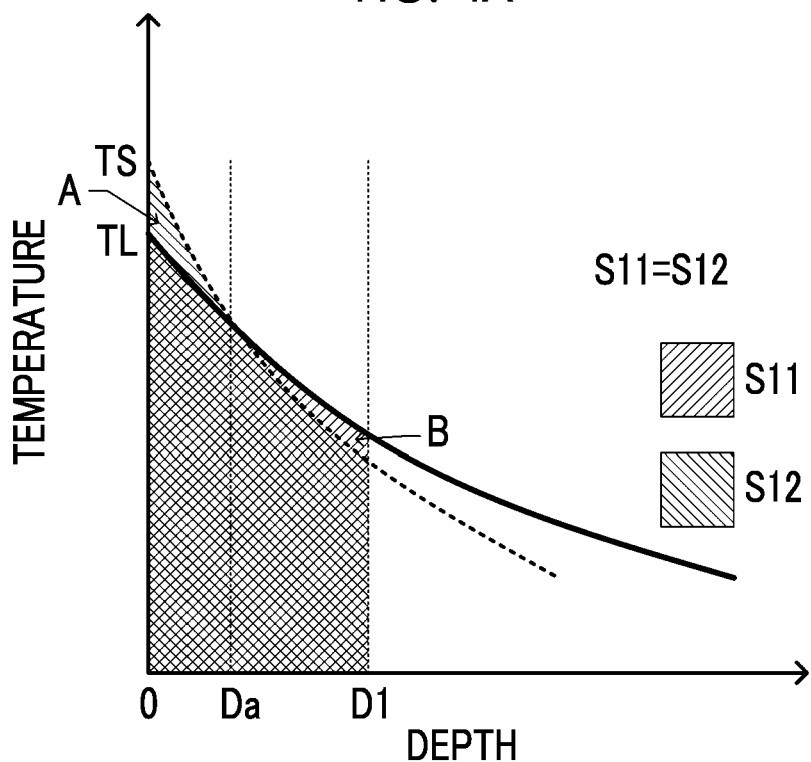
FIGS. 4A and 4B are graphs showing an example of temperature distribution in a depth direction when a pulsed laser beam is incident on a semiconductor wafer.
Figure 4B:
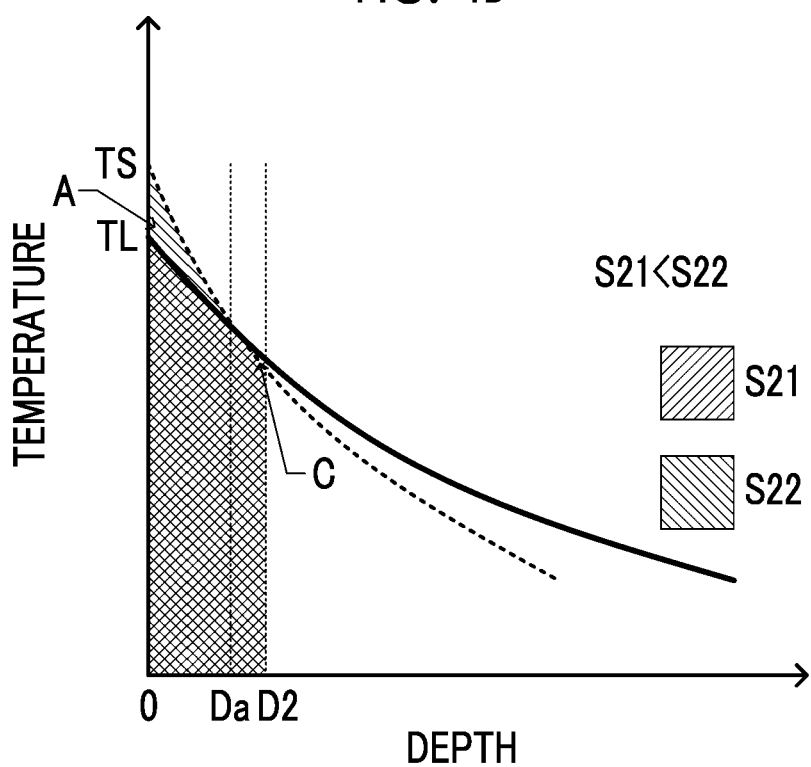

FIGS. 4A and 4B are graphs showing an example of temperature distribution in a depth direction at the time of falling edge of the laser pulse when a pulsed laser beam is incident on the semiconductor wafer 35. The horizontal axis of the graphs of FIGS. 4A and 4B represents the depth from the surface of the semiconductor wafer 35, and the vertical axis represents the temperature. The solid line and the broken line in each of FIGS. 4A and 4B respectively show the temperature distributions when a laser pulse having the same pulse energy and a relatively long pulse width and a laser pulse having a relatively short pulse width are incident.

When the pulse energies are the same, the shorter the pulse width, the larger the peak power. Therefore, the temperature TS of the outermost surface (position of zero depth) when the pulse width is short is higher than the temperature TL of the outermost surface when the pulse width is long. As the pulse width increases, the amount of heat conducted in the depth direction during the period during which the laser pulse is incident increases. On the contrary, when the pulse width decreases, the amount of heat conducted in the depth direction during the period during which the laser pulse is incident decreases. Regardless of the pulse width, the deeper the depth from the surface, the lower the temperature, but the shorter the pulse width, the smaller the amount of heat conducted in the depth direction, so that the degree of temperature decrease is greater when the pulse width is short. Therefore, in a region deeper than a certain depth Da, the temperature when the pulse width is long is higher than the temperature when the pulse width is short.

The radiant light emitted from the outermost surface reaches the photodetector 20 without being absorbed by the semiconductor wafer 35. On the other hand, a part of the radiant light emitted from the deep region is absorbed by the semiconductor wafer 35 itself by the time the radiant light reaches the photodetector 20. The amount absorbed depends on the absorption coefficient of the semiconductor wafer 35. This absorption coefficient depends on the wavelength. The radiant light in the wavelength range having a large absorption coefficient is unlikely to be radiated from the deep region of the semiconductor wafer 35 to the outside.

In the following description, the absorption phenomenon of radiant light is simplified, it is assumed that one light receiving unit 21 detects radiant light emitted from a region shallower than the depth D1 and the other light receiving unit 21 detects radiant light emitted from a region shallower than the depth D2 (D2<D1).

As shown in FIG. 4A, the detected value of the one light receiving unit 21 changes according to the area of the hatched portion in the region shallower than the depth D1. As shown in FIG. 4B, the detected value of the other light receiving unit 21 changes according to the area of the hatched portion in the region shallower than the depth D2.

In the example shown in FIG. 4A, in the region where the depth is shallower than Da, the area of the temperature distribution when the pulse width is short is larger than the area of the temperature distribution when the pulse width is long, and the difference is A. In the region where the depth is from Da to D1, conversely, the area of the temperature distribution when the pulse width is long is larger than the area of the temperature distribution when the pulse width is short, and the difference is B. When the area A and the area B are equal, the area S11 of the graph of the temperature distribution when the pulse width is long and the area S12 of the graph of the temperature distribution when the pulse width is short are substantially equal. Therefore, it is not possible to distinguish between the temperature distribution of the solid line and the temperature distribution of the broken line in FIG. 4A only by the detected value of the light receiving unit 21 that detects the radiant light from the region having a depth shallower than D1. Therefore, it is difficult to accurately obtain the highest reached temperature of the outermost surface of the semiconductor wafer 35.

On the other hand, in the example shown in FIG. 4B, in the region where the depth is from Da to D2, the area of the temperature distribution when the pulse width is long is larger than the area of the temperature distribution when the pulse width is short, and the difference is C. The area C is smaller than the area A. Therefore, the area S21 of the graph of the temperature distribution when the pulse width is long is smaller than the area S22 of the graph of the temperature distribution when the pulse width is short. Since the area S21 and the area S22 are different, the temperature distribution of the solid line and the temperature distribution of the broken line in FIG. 4B may be distinguished, based on the detected value of the light receiving unit 21 that detects the radiant light from the region having a depth shallower than D2.

As in the present embodiment, by separately measuring the intensities of radiant light in different wavelength ranges with the two light receiving units 21, it becomes possible to measure more accurately the temperature of the outermost surface of the semiconductor wafer 35 when the temperature distribution in the depth direction is different.

FIGS. 5A to 5D are graphs showing the temperature distribution in the depth direction when the pulse width of the pulsed laser beam is constant and the pulse energies are different. The horizontal axis of the graphs of FIGS. 5A to 5D represents the depth from the surface of the semiconductor wafer 35, and the vertical axis represents the temperature.

Figure 5A:
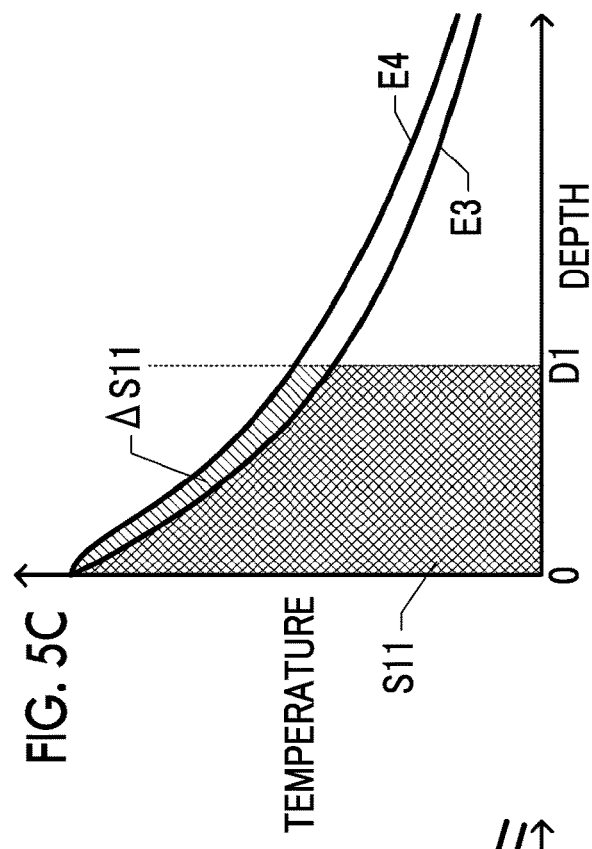
FIGS. 5A to 5D are graphs showing the temperature distribution in the depth direction when the pulse width of the pulsed laser beam is constant and the pulse energies are different.
Figure 5B:
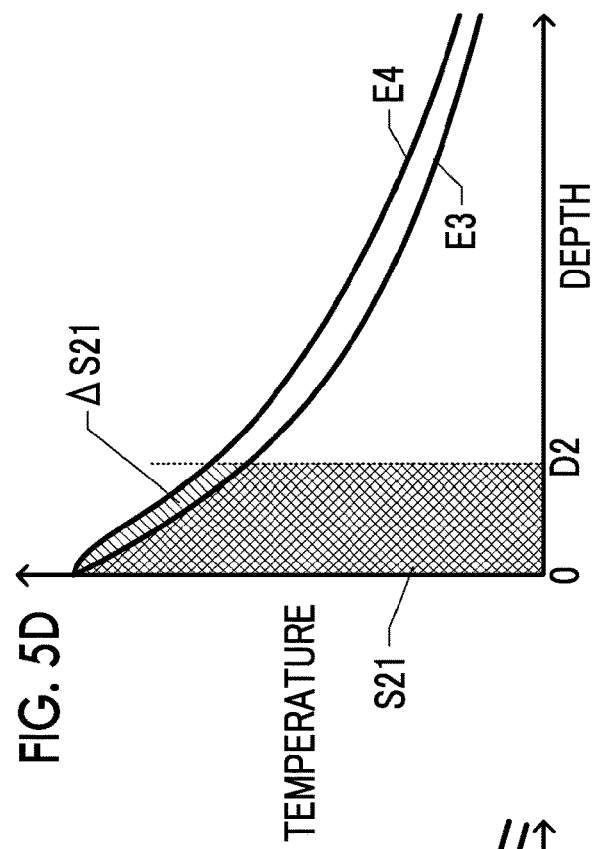

FIGS. 5A and 5B show the temperature distribution when one shot of a pulsed laser beam is incident under the condition of pulse energies E1 and E2 (E1<E2) in which the temperature of the outermost surface of the semiconductor wafer 35 does not exceed the melting point. The temperature of the outermost surface is the highest, and the deeper the depth, the lower the temperature. When the pulse energy increases from E1 to E2, the temperature at each depth of the semiconductor wafer 35 rises, but the shape of the temperature distribution is almost maintained.

The peak intensity Vp (FIG. 3) of the signal output from the light receiving unit 21 that detects the radiant light from the region whose depth is shallower than D1 has a magnitude corresponding to the area S11 (FIG. 5A) when the pulse energy is E1, and has a magnitude corresponding to the sum of the area S11 (FIG. 5A) and the increment ΔS11 (FIG. 5A) when the pulse energy is E2. The peak intensity Vp (FIG. 3) of the signal output from the light receiving unit 21 that detects the radiant light from the region whose depth is shallower than D2 has a magnitude corresponding to the area S21 (FIG. 5B) when the pulse energy is E1, and has a magnitude corresponding to the sum of the area S21 (FIG. 5B) and the increment ΔS21 (FIG. 5B) when the pulse energy is E2.

Figure 5C:
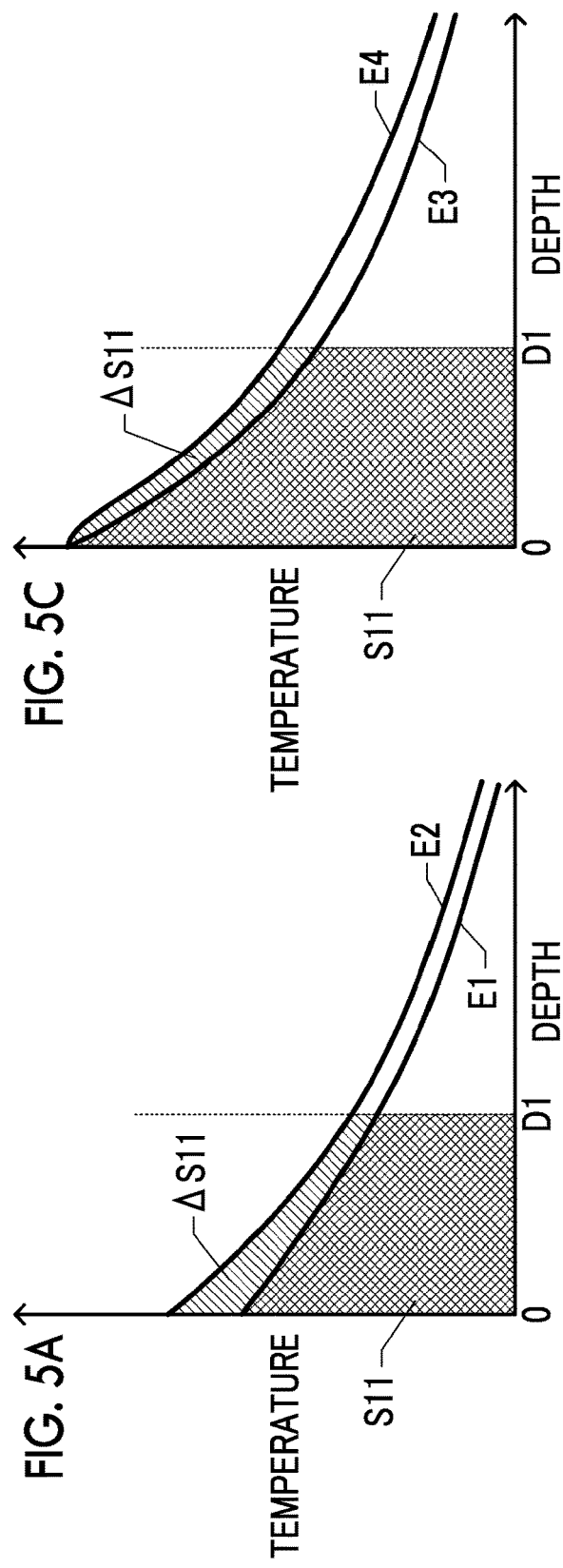
Figure 5D:
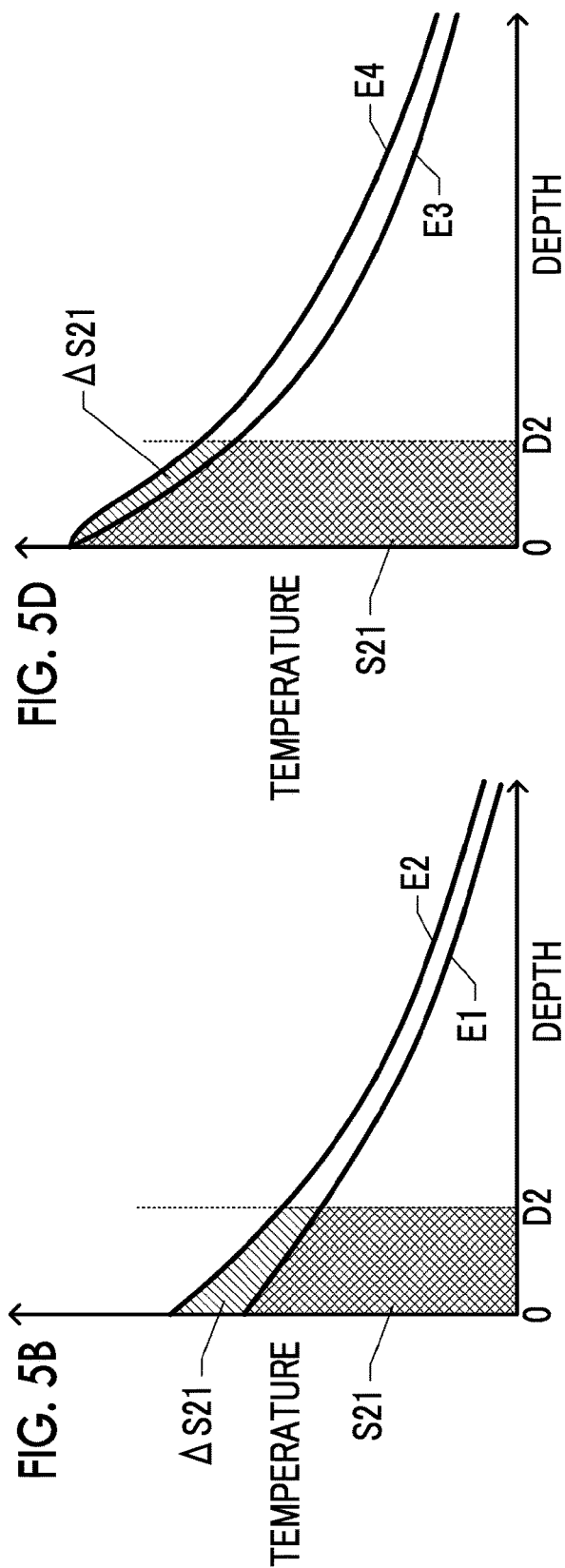

FIGS. 5C and 5D show the temperature distribution when one shot of a pulsed laser beam is incident under the condition of pulse energies E3 and E4 (E3<E4) in which the temperature of the outermost surface of the semiconductor wafer 35 is equal to or higher than the melting point. Under the condition that the pulse energy is E3, the temperature of the outermost surface of the semiconductor wafer 35 reaches the melting point. Under the condition that the pulse energy is E4, the outer layer portion of the semiconductor wafer 35 is melted. When the outer layer portion of the semiconductor wafer 35 begins to melt, the temperature of the outermost surface is fixed to almost the melting point. Therefore, the temperature of the outermost surface is almost the same, when the pulse energy is E3 and when the pulse energy is E4. Since the temperature of the deep region where melting is not performed rises with the increase of the pulse energy, the temperature when the pulse energy is E4 is higher than the temperature when the pulse energy is E3.

The peak intensity Vp (FIG. 3) of the signal output from the light receiving unit 21 that detects the radiant light from the region whose depth is shallower than D1 has a magnitude corresponding to the area S11 (FIG. 5C) when the pulse energy is E3, and has a magnitude corresponding to the sum of the area S11 (FIG. 5C) and the increment ΔS11 (FIG. 5C) when the pulse energy is E4. The peak intensity Vp (FIG. 3) of the signal output from the light receiving unit 21 that detects the radiant light from the region whose depth is shallower than D2 has a magnitude corresponding to the area S21 (FIG. 5D) when the pulse energy is E3, and has a magnitude corresponding to the sum of the area S21 (FIG.

5D) and the increment ΔS21 (FIG. 5D) when the pulse energy is E4. Here, for the sake of simplicity, the difference between the emissivity from the semiconductor in the molten state and the emissivity from the semiconductor in the solid state is not considered.

When the outermost surface of the semiconductor wafer 35 begins to melt, the temperature of the outermost surface hardly rises even when the pulse energy is increased. Therefore, the ratio of the increment ΔS11 to the area S11 (FIG. 5C) and the ratio of the increment ΔS21 to the area S21 (FIG. 5D) is smaller than the ratio when the outermost surface does not melt (FIGS. 5A and 5B). That is, the slope of the change in the output value of the light receiving unit 21 with respect to the increase in pulse energy becomes gentle. The pulse energy when this slope starts to become gentle can be considered as the energy condition for the start of melting. In order to anneal the semiconductor wafer 35 at a temperature as high as possible under the condition where the semiconductor wafer 35 is not melted, it is desired to accurately find the energy condition where melting starts.

FIG. 6 is a graph that approximates a curve of a scatter plot in which the output values of the two light receiving units 21 are plotted with respect to the pulse energy. The detected values of the light receiving units 21 that detect the radiant light from the regions having depths shallower than D1 and D2 are shown by a thick curve D1 and a thin curve D2, respectively.

In the scatter plot shown in FIG. 6, it is assumed that melting starts under the condition that the pulse energy is E1. The slopes of the graphs change near the condition where melting starts, but no clear bend point appears. Therefore, it is difficult to accurately find the condition where melting starts, from the measurement result of one light receiving unit 21.

The ratios of the increments ΔS11 (FIG. 5C) and ΔS21 (FIG. 5D) to the areas S11 (FIG. 5C) and S21 (FIG. 5D) after the start of melting are smaller than the ratios of the increments ΔS11 (FIG. 5A) and ΔS21 (FIG. 5B) to the areas S11 (FIG. 5A) and S21 (FIG. 5B) before the start of melting, respectively. Therefore, when the pulse energy exceeds E1, the slope of the graph becomes gentle. However, the degree to which the ratio of the increment ΔS21 to the area S21 becomes smaller is larger than the degree to which the ratio of the increment ΔS11 to the area S11 becomes smaller. This is because the temperature rise is reduced in the region shallower than the depth D2. Therefore, in the graph shown in FIG. 6, the degree to which the slope of the graph becomes gentle when the pulse energy exceeds E1 is larger in the curve D2 than in the curve D1.

Since the degree to which the slope becomes gentle differs between the curve D1 and the curve D2, the pulse energy satisfying the condition where melting starts and the output values of the light receiving units 21 at that time can be specified more accurately, by comparing the changes in the output values of the two light receiving units 21 when the pulse energy is changed. For example, the pulse energy E1 at the start of melting can be more accurately specified from the relationship between the pulse energy and the difference between the value shown by the curve D1 and the value shown by the curve D2 with respect to the pulse energy.

In order to improve accuracy of specifying the pulse energy satisfying the condition where melting starts and the output value of the light receiving unit 21 at that time, it is preferable to increase the difference in the absorption coefficient of the semiconductor wafer 35 at the peak sensitivity wavelengths of the two light receiving units 21. For example, the peak sensitivity wavelengths of the two light receiving units 21 may be set so as to satisfy the condition that the larger absorption coefficient is twice or more the smaller absorption coefficient.

When the semiconductor wafer 35 is made of silicon, it is preferable that the peak sensitivity wavelength of the one light receiving unit 21 is a wavelength that is not transparent to silicon, for example, 1 μm or less, in order to read the temperature information on the outermost surface. For example, it is preferable to set the wavelength range of visible light having a wavelength of 400 nm or more and 800 nm or less or the wavelength range of near infrared rays having a wavelength of about 900 nm.

FIG. 7 is a flowchart showing a procedure for performing laser annealing of the semiconductor wafer 35 by using a laser annealing device equipped with a process monitor according to an embodiment.

First, the semiconductor wafer 35 (FIG. 1) into which the dopant is injected is held in the stage 31 (FIG. 1) (step S1). This procedure is performed by, for example, a robot arm or the like. The stage 31 fixes the semiconductor wafer 35 by, for example, a vacuum chuck.

After holding the semiconductor wafer 35 on the stage 31, the output of the pulsed laser beam from the laser source 11 and the movement of the stage 31 are started (step S2). While scanning the semiconductor wafer 35 with the pulsed laser beam, the intensity of the radiant light from the semiconductor wafer 35 is measured by the photodetector 20 (step S3). For example, the processing device 40 acquires the output value of the photodetector 20.

The processing device 40 stores the in-plane position of the semiconductor wafer 35 on which the laser beam is incident and the output value of the photodetector 20 in the storage device 41 in association with each other (step S4). The processes of steps S3 and S4 are repeated until almost the entire surface of the semiconductor wafer 35 is annealed (step S5).

When the annealing of almost the entire surface of the semiconductor wafer 35 is completed, the processing device 40 calculates the reached temperature of the outermost surface of the semiconductor wafer 35, based on the output value of the photodetector 20 (step S6). For example, the relationship between the output values of the two light receiving units 21 and the reached temperature of the outermost surface of the semiconductor wafer 35 is obtained in advance and is stored in the storage device 41. The processing device 40 outputs the calculated value of the reached temperature of the outermost surface of the semiconductor wafer 35 to the output device 42 (FIG. 1) in association with the in-plane position of the semiconductor wafer 35 (step S7). For example, the distribution of the reached temperature in the plane of the semiconductor wafer 35 may be represented as a figure.

By using the process monitor according to the above embodiment, the reached temperature of the outermost surface of the semiconductor wafer 35 can be obtained with higher accuracy. Therefore, it is possible to determine with high accuracy whether or not the outermost surface of the semiconductor wafer 35 is melted.

Next, a modification example of the above embodiment will be described.

In the above embodiment, the number of light receiving units 21 (FIGS. 2A and 2B) included in the photodetector 20 is two, but the photodetector 20 may include a plurality of (three or more) light receiving units 21. Since three or more light receiving units 21 having different peak sensitivity wavelengths are disposed, the photodetector 20 can measure the intensities of radiant light in the plurality of (three or more) wavelength ranges. This makes it possible to improve accuracy of specifying the pulse energy satisfying the condition where melting starts and the output value of the light receiving unit 21 at that time.

In the above embodiment, the reached temperature of the outermost surface of the semiconductor wafer 35 is obtained based on the measurement result of the photodetector 20, but it is also possible to obtain other physical quantities related to the semiconductor wafer 35 that change due to annealing. For example, by obtaining the relationship between the activation rate of the dopant, the sheet resistance, or the like and the measurement result of the photodetector 20 in advance, these physical quantities can be obtained based on the measurement result of the photodetector 20.

In the above embodiment, the semiconductor wafer is to be annealed, but the process monitor according to the embodiment can also be used when a semiconductor member other than the semiconductor wafer is to be annealed. Further, in the above embodiment, laser annealing is applied as an annealing method for the semiconductor wafer, but other annealing methods may be applied. For example, lamp annealing, furnace annealing, or the like may be applied. When annealing is performed by a method that causes a temperature distribution in the depth direction, a particularly excellent effect can be obtained by using the process monitor according to the above embodiment.

Needless to say, the above-described embodiment is merely an example, and partial replacement or combination of the configurations shown in the embodiment and modification example is possible. The same effects due to the same configurations of the embodiment and modification example will not be sequentially described for each of the embodiment and modification example. Further, the present invention is not limited to the above-described embodiment. For example, it will be apparent to those skilled in the art that various modifications, improvements, combinations, or the like can be made.

It should be understood that the invention is not limited to the above-described embodiment, but may be modified into various forms on the basis of the spirit of the invention. Additionally, the modifications are included in the scope of the invention.

What is claimed is:

1. A process monitor comprising:
   a photodetector includes a plurality of light receiving units configured to separately measure intensities of radiant light from a semiconductor member being annealed, in a plurality of wavelength ranges that are different from each other; and
   a processing device configured to obtain a physical quantity related to the semiconductor member that changes due to annealing by a laser beam, based on the intensities in the plurality of wavelength ranges measured by the photodetector;
   a beam spot of the laser beam on a surface of the semiconductor member has a long shape that is elongated in one direction,
   an imaging optical system including two lenses that forms an image of the beam spot;
   the plurality of light receiving units are disposed at different positions in a longitudinal direction of the image of the beam spot; and
   one light receiving unit of the plurality of light receiving units detects the radiant light emitted from a region shallower than a depth D1 and another light receiving unit of the plurality of light receiving units detects the radiant light emitted from a region shallower than a depth D2 wherein D2<D1.

2. The process monitor according to claim 1, wherein
   the photodetector is further configured to detect the radiant light from the semiconductor member whose outer layer portion is heated by input of the laser beam, and
   the processing device is further configured to obtain a reached temperature of an outermost surface of the semiconductor member, as the physical quantity related to the semiconductor member that changes due to annealing.

3. The process monitor according to claim 2, wherein
   the photodetector includes the plurality of light receiving units that separately measure the intensities of radiant light in the plurality of wavelength ranges.

4. The process monitor according to claim 3, wherein
   each of the plurality of light receiving units includes an optical sensor having a different peak sensitivity wavelength.

5. The process monitor according to claim 3, wherein
   each of the plurality of light receiving units includes an optical sensor having a same spectral sensitivity characteristic, and a bandpass filter having a different passing wavelength range, and wherein radiant light transmitted through the bandpass filter is incident on the optical sensor.

* * * * *